United States Patent
Pan

(10) Patent No.: US 8,722,483 B2
(45) Date of Patent: May 13, 2014

(54) METHOD FOR MANUFACTURING DOUBLE-LAYER POLYSILICON GATE

(71) Applicants: Peking University Founder Group Co., Ltd., Beijing (CN); Founder Microelectronics International Co., Ltd., Shenzhen (CN)

(72) Inventor: Guangran Pan, Shenzhen (CN)

(73) Assignees: Peking University Founder Group Co., Ltd., Beijing (CN); Founder Microelectronics International Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/729,338

(22) Filed: Dec. 28, 2012

(65) Prior Publication Data

US 2013/0183821 A1 Jul. 18, 2013

(30) Foreign Application Priority Data

Dec. 28, 2011 (CN) .......................... 2011 1 0448357

(51) Int. Cl.
*H01L 21/8238* (2006.01)

(52) U.S. Cl.
USPC ........... 438/199; 438/283; 438/294; 438/454; 438/585; 438/587

(58) Field of Classification Search
USPC ......... 438/140, 179, 199, 283, 454, 583, 585, 438/587–588, 294, 595
See application file for complete search history.

(56) References Cited

U.S. PATENT DOCUMENTS

2004/0063264 A1* 4/2004 Zheng et al. .................. 438/199

* cited by examiner

*Primary Examiner* — Thanhha Pham
(74) *Attorney, Agent, or Firm* — Finnegan, Henderson, Farabow, Garrett & Dunner, LLP

(57) ABSTRACT

The invention discloses a method for manufacturing a dual-layer polysilicon gate. The method includes: depositing silicon nitride on silicon oxide of an integrated circuit to be processed; performing anisotropic etching on the silicon nitride to form sidewalls of silicon nitride on sidewalls of a first layer of polysilicon gate of the integrated circuit to be processed; manufacturing a second layer of polysilicon gate; and rinsing the sidewalls of silicon nitride.

14 Claims, 14 Drawing Sheets

METHOD FOR MANUFACTURING DOUBLE-LAYER POLYSILICON GATE

RELATED APPLICATIONS

This application claims the benefit of Chinese Patent Application No. 201110448357.2, filed on Dec. 28, 2011.

FIELD

The present invention relates to the field of manufacturing a semiconductor integrated circuit and particularly to a method for manufacturing a dual-layer polysilicon gate.

BACKGROUND

Terms

N-well: an N-type well diffused on a substrate; P-well: a P-type well diffused on a substrate; N+: an N-type heavily doped area; P+: a P-type heavily doped area; Fox: a field oxide layer; and Pbody: a P-type doped body area.

An MOS transistor is an elementary unit constituting a semiconductor integrated circuit and constituted of a well, a source, a drain and a gate, and polysilicon is typically used as the gate of the MOS transistor in the semiconductor integrated circuit, i.e., a polysilicon gate.

In some types of integrated circuits, e.g., some BCD integrated circuits (Bipolar-Complementary MOS-Power Dual Diffusive MOS integrated circuits), two layers of polysilicon are included and both of them act as gates of an MOS transistor, which are referred respectively to as a first layer of polysilicon gate and a second layer of polysilicon gate.

A structure of a dual-layer polysilicon gate will be introduced below taking a BCD integrated circuit as an example as illustrated in FIG. 1.

In FIG. 1, two MOS transistors in a BCD integrated circuit, i.e., a low voltage NMOS and a power LDNMOS are depicted. A first layer of polysilicon gate (the poly-Si 1 in FIG. 1) is a gate of the power LDNMOS, and a second layer of polysilicon gate (the poly-Si 2 in FIG. 1) is a gate of the low voltage NMOS, where a thick oxide layer is indicated as Fox. The area covered by the Fox is a field area, and the area which is not covered by the Fox is an active area with the surface thereof being a thin oxide layer of gate oxide. The gate oxide beneath the poly-Si 1 and the poly-Si 2 is referred respectively to as a first layer of gate oxide and a second layer of gate oxide. N+ is a source and a drain of the MOS transistor, and Pbody is a body area of the power LDNMOS.

In the prior art, a method of manufacturing the dual-layer polysilicon gate is as illustrated in FIG. 2:

The step 201 is to manufacture an N-well and a P-well on a substrate (see FIG. 3);

The step 202 is to manufacture an active area and a field area (see FIG. 4 where the area covered by the Fox is a field area, and the area which is not covered by the Fox is an active area);

The step 203 is to grow a first layer of gate oxide on the active area (see FIG. 5);

The step 204 is to deposit a first layer of polysilicon, and perform a photolithographic process on and etch the first layer of polysilicon to form a first layer of polysilicon gate (see FIG. 6, i.e., the poly-Si 1 in FIG. 6);

The step 205 is to dope the Pbody (see FIG. 7);

The step 206 is to perform lower-pressure chemical vapor deposition of silicon oxide (LPTEOS) (see FIG. 8);

The step 207 is to sinter the Pbody at high temperature (see FIG. 9);

The step 208 is to wet-etch silicon oxide (see FIG. 10);

The step 209 is to grow a second layer of gate oxide (see FIG. 11);

The step 210 is to deposit a second layer of polysilicon (see FIG. 12); and

The step 211 is to perform a photolithographic process on and etch the second layer of polysilicon to form a second layer of polysilicon gate (see FIG. 13, i.e., the poly-Si 2 in FIG. 13).

After the foregoing steps are performed, the dual-layer polysilicon gate has been manufactured, and all the other steps are standard processes known to those skilled in the art, e.g., manufacture of N+ and P+ heavily doped areas (see FIG. 14).

The inventors have identified during making of the invention at least the following two drawbacks that are difficult to overcome in the foregoing manufacturing method: first, in the step 208, silicon oxide is wet-etched by eroding the bared LPTEOS and first layer of gate oxide using diluted hydrofluoric acid, and the gate oxide layer beneath the poly-Si 1 will not be eroded due to shielding by polysilicon, but the first layer of gate oxide at the edges of the poly-Si 1 may be easily damaged by the eroding solution, thus degrading the reliability of the device; and second, in the step 211, the area reserved for the second layer of polysilicon gate is covered by photoresist, and the photoresist in the other area is not reserved, and then the poly-Si 2 in the area which is not covered by the photoresist is etched in a dry etching process, and next the photoresist is removed, and this etching method makes the thickness of the poly-Si 2 in the area of the sidewalls of the poly-Si 1 (particularly the longitudinal thickness referred to as d1 in FIG. 12 here and throughout the following description) much larger than the thickness d2 of the poly-Si 2 in the planar area, thus making the etching process rather difficult.

SUMMARY

The invention provides a method for manufacturing a dual-layer polysilicon gate so as to address the problems in the prior art that the first layer of gate oxide at the edges of the first layer of polysilicon gate may be easily damaged by the eroding solution, thus degrading the reliability of the device, and the difficulty in the process of etching the second layer of polysilicon.

The invention provides a method for manufacturing a dual-layer polysilicon gate, which is applicable to an integrated circuit to be processed, where the manufacturing method includes: depositing silicon nitride on silicon oxide of the integrated circuit to be processed; performing anisotropic etching on silicon nitride to form sidewalls of silicon nitride on sidewalls of a first layer of polysilicon gate of the integrated circuit to be processed; manufacturing a second layer of polysilicon gate; and rinsing the sidewalls of silicon nitride.

Preferably, the anisotropic etching on silicon nitride is vertical downward etching using dry plasmas.

Preferably, the thickness of silicon nitride is 1000 to 3000 angstroms.

Preferably, the manufacturing a second layer of polysilicon gate includes: growing a second layer of gate oxide on the surface of an active area and the first layer of polysilicon gate of the integrated circuit to be processed; depositing a second layer of polysilicon on the second layer of gate oxide; and etching the second layer of polysilicon to form the second layer of polysilicon gate.

Preferably, thermal processing is further preformed on a doped area of the integrated circuit to be processed before the anisotropic etching on silicon nitride.

Preferably, the thermal processing is sintering at high temperature.

Preferably, the temperature of the sintering at high temperature is 1050 to 1150 degrees centigrade.

Advantageous effects of the invention are as follows:

In an embodiment of the invention, silicon nitride is deposited on silicon oxide, and anisotropic etching is performed on the silicon nitride, and then the sidewalls of silicon nitride are formed on the sidewalls of the first layer of polysilicon gate, so the first layer of gate oxide beneath the first layer of polysilicon gate will not be damaged during etching of silicon oxide, thus improving the reliability of the device; and furthermore, the sidewalls of silicon nitride can mitigate a step arising from the first layer of polysilicon gate, thus, lowering the difficulty of the process of etching the second layer of polysilicon.

DETAILED DESCRIPTION OF THE EMBODIMENTS

Figure 1:
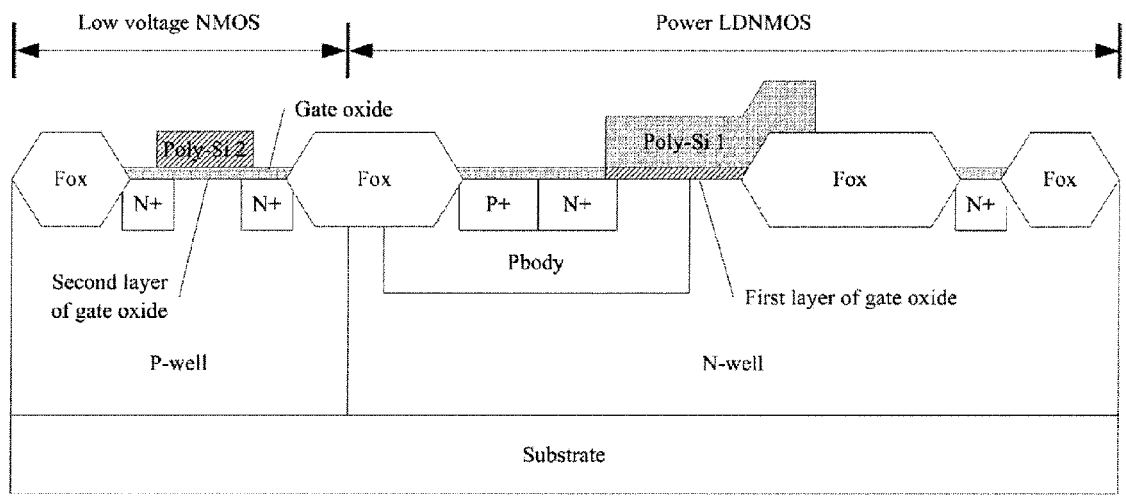
FIG. 1 is a structural diagram of a dual-layer polysilicon gate in an ideal status.
Figure 2:
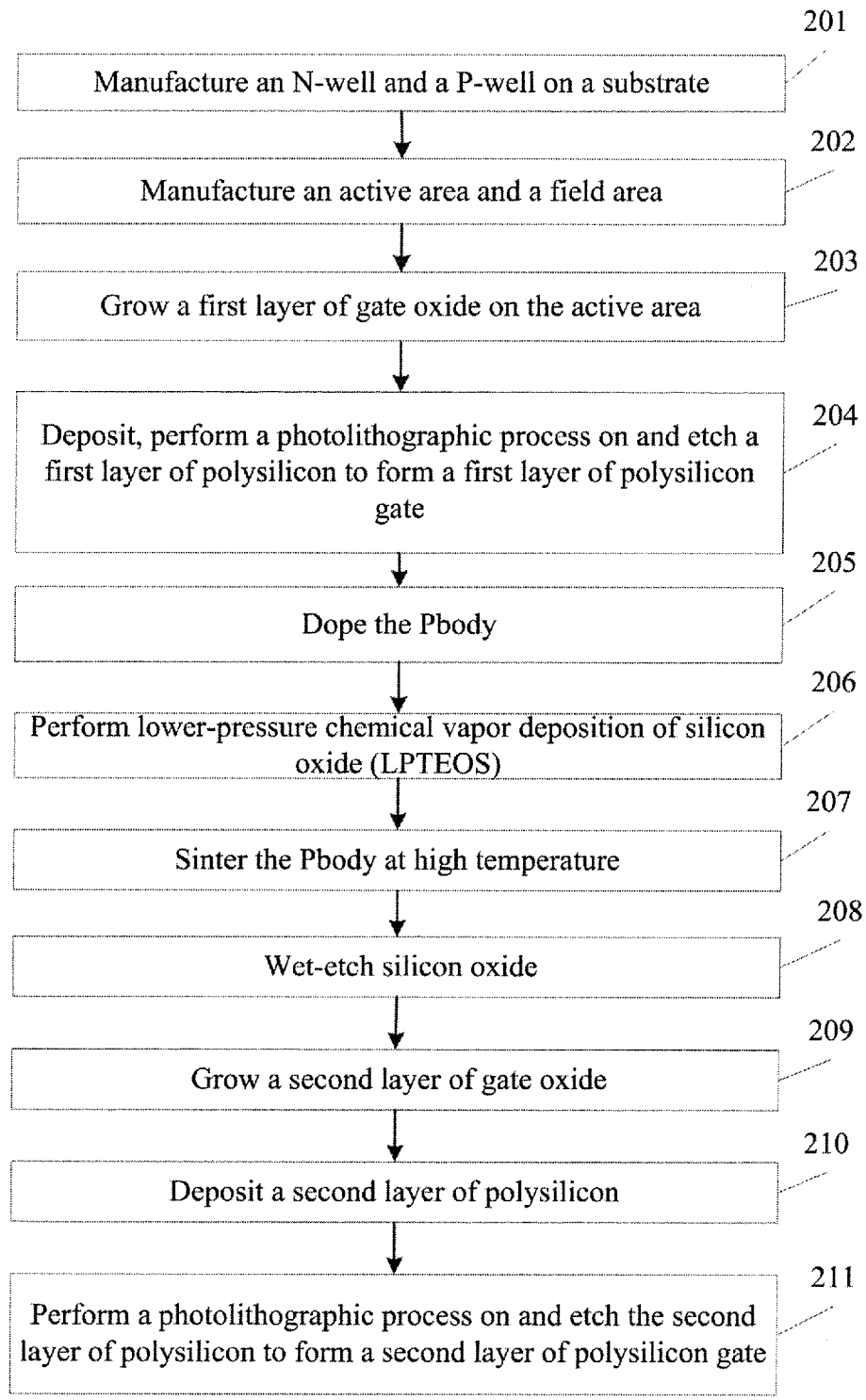
FIG. 2 is a flow chart of a method for manufacturing a dual-layer polysilicon gate in the prior art.
Figure 3:
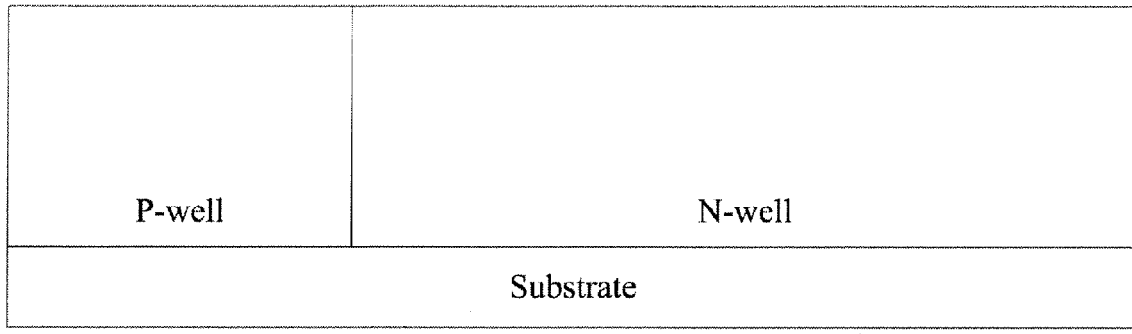
FIG. 3 to FIG. 14 are structural diagrams after respective steps in the manufacturing method in FIG. 2 are performed respectively.
Figure 4:
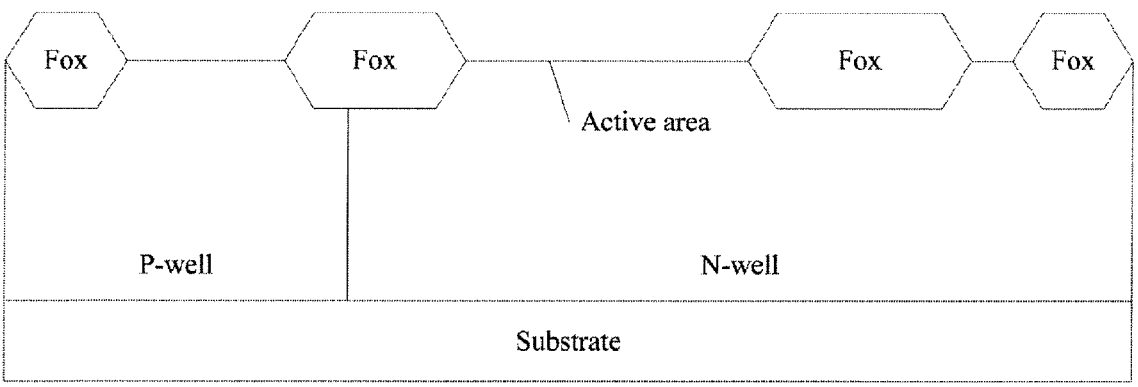
Figure 5:
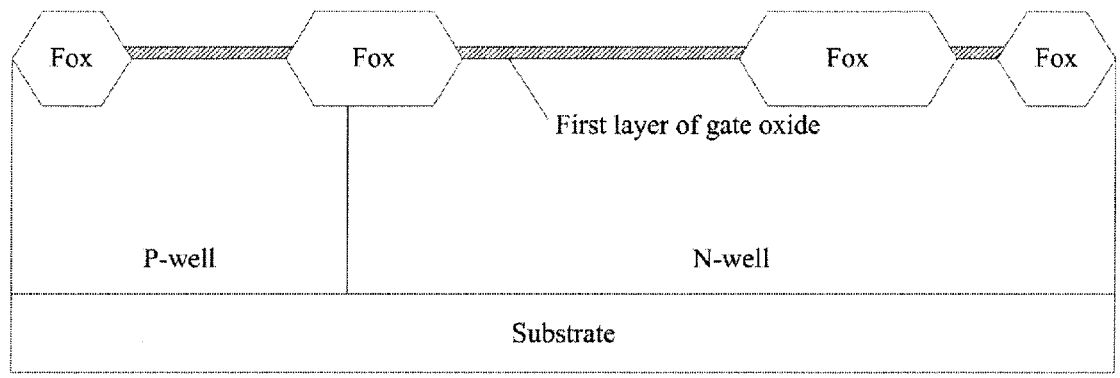
Figure 6:
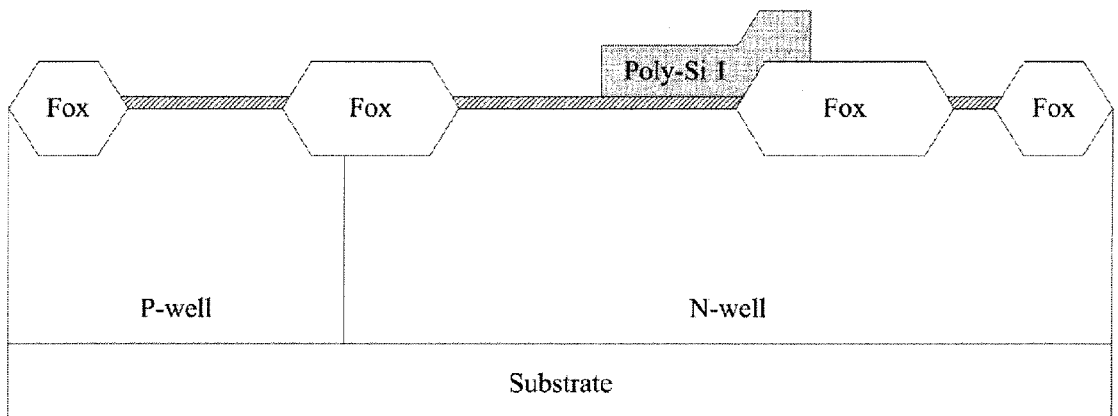
Figure 7:
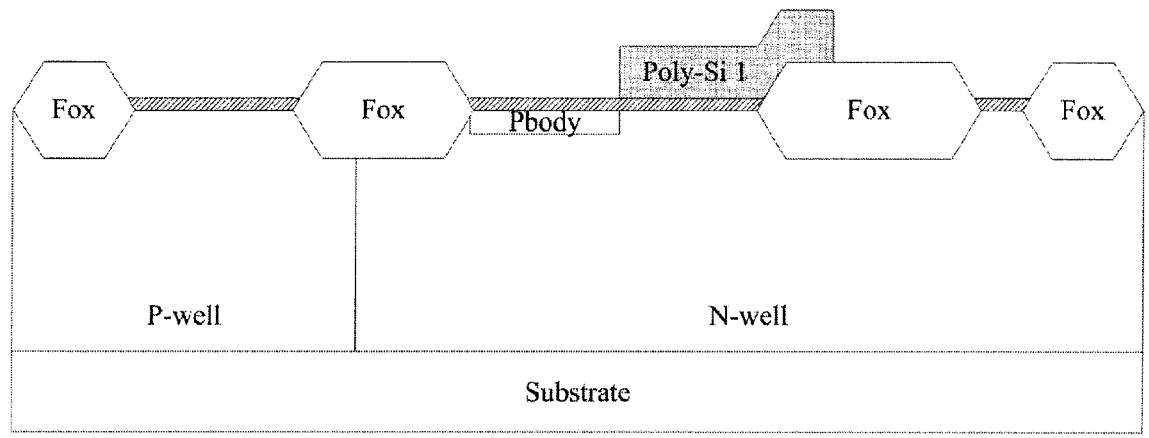
Figure 8:
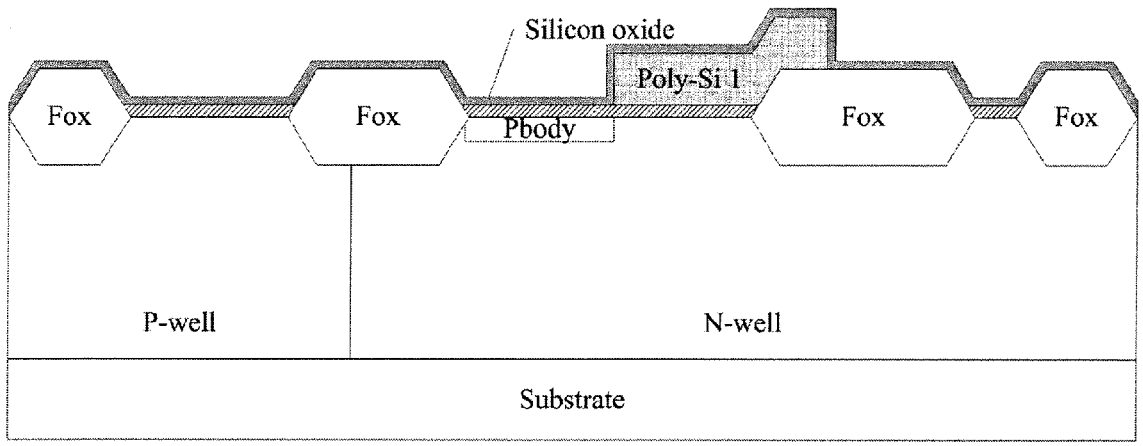
Figure 9:
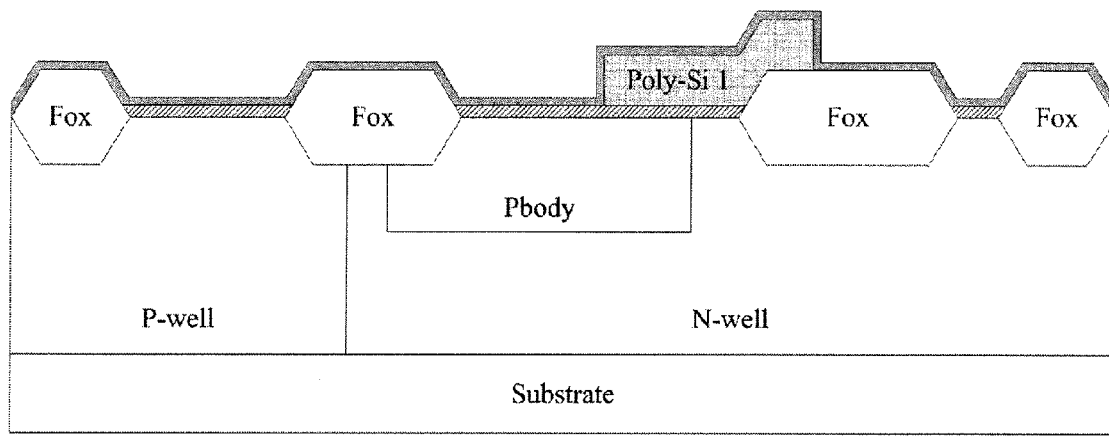
Figure 10:
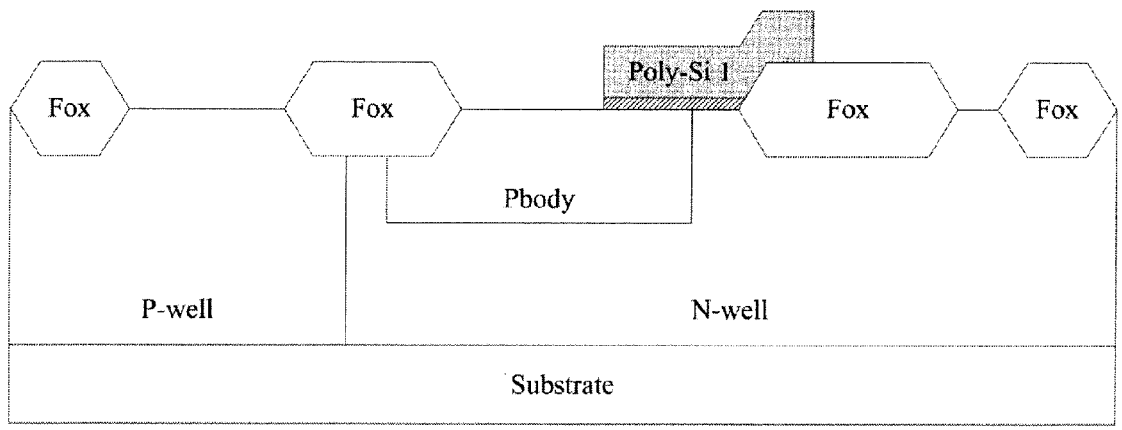
Figure 11:
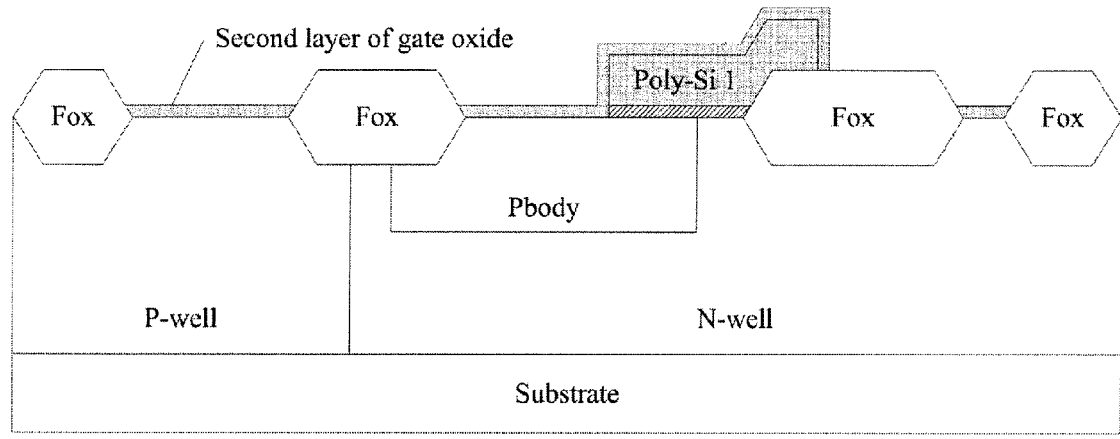
Figure 12:
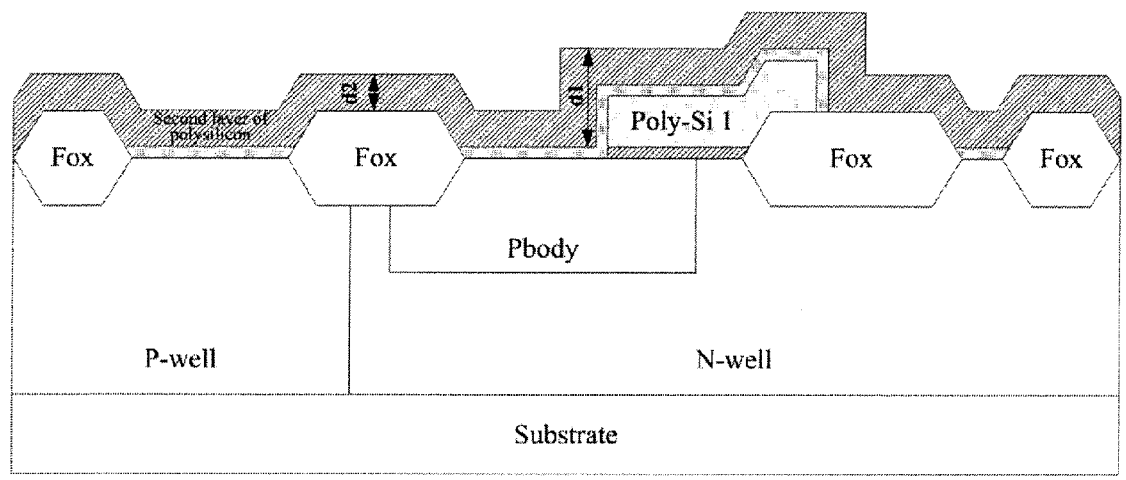
Figure 13:
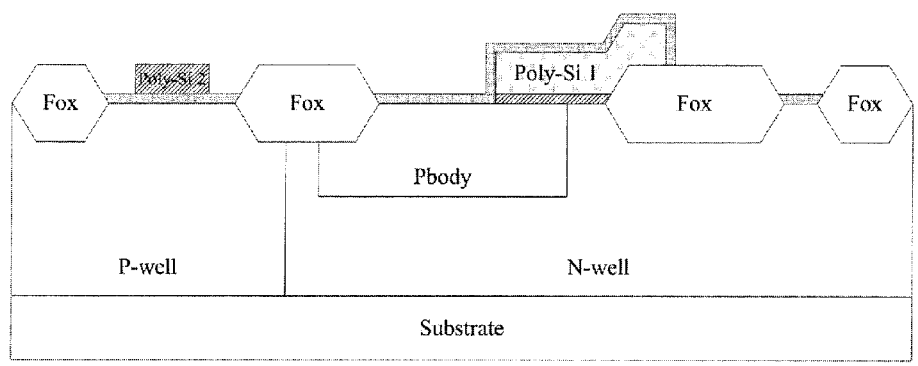
Figure 14:
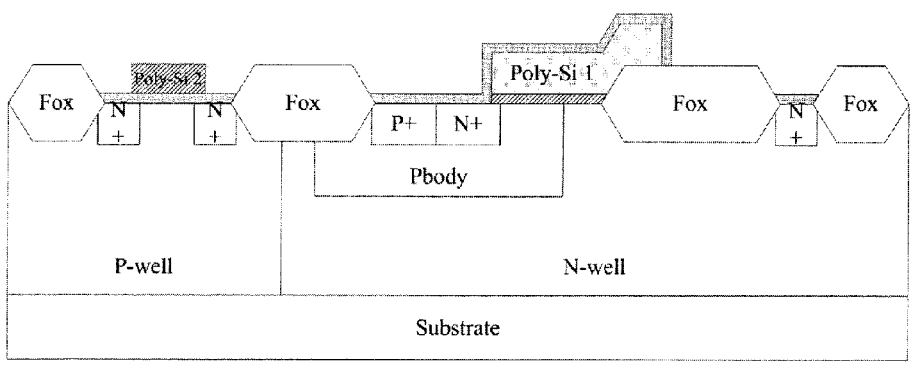
Figure 15:
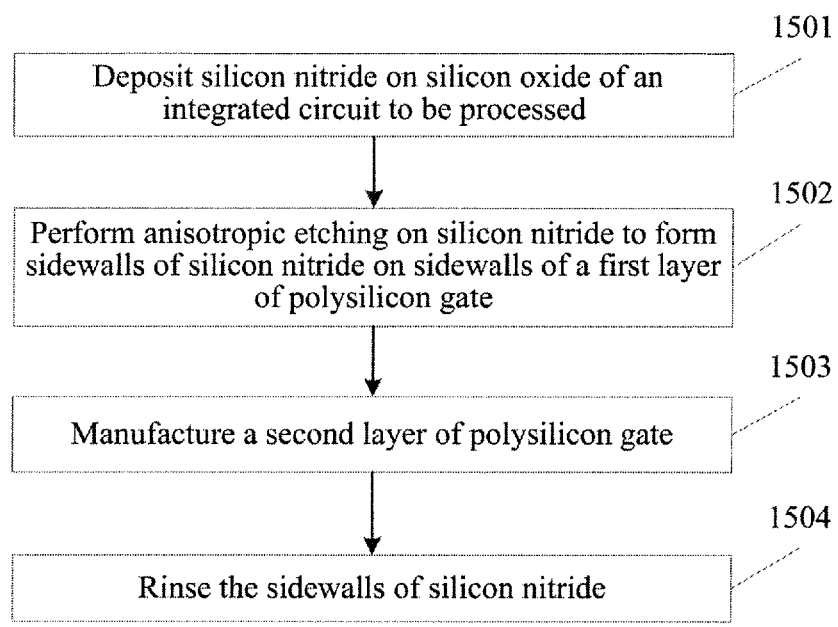
FIG. 15 is a flow chart of a method for manufacturing a dual-layer polysilicon gate according to an embodiment of the invention.

An embodiment of the present invention provides a method for manufacturing a dual-layer polysilicon gate for processing an integrated circuit to be processed, and this embodiment will be described taking a BCD integrated circuit as an example. The integrated circuit to be processed includes: a substrate; an N-well and a P-well Ruined on the substrate (see FIG. 3); a field oxide layer, arranged on the N-well and the P-well, formed with an active area and a field area, where the area covered by the field oxide layer is the field area, and the area which is not covered by the field oxide layer is the active area (see FIG. 4); a first layer of gate oxide formed on the active area (see FIG. 5); a first layer of polysilicon gate formed on the first layer of gate oxide (see FIG. 6); a doped area formed on the N-well, where in this embodiment, the doped area is a Pbody, for example, but doping can be performed dependent upon structure and parameter requirements of the device in a practical application (see FIG. 7); and silicon oxide overlying the field oxide layer, the first layer of gate oxide and the first layer of polysilicon gate, where silicon oxide is low-pressure chemical vapor deposited silicon oxide, i.e., LPTEOS (see FIG. 8), with a typical thickness of 200 to 600 angstroms for the purpose of preventing the silicon surface and the surface of the first layer of polysilicon gate from being nitrided in a subsequent thermal processing procedure. Reference is made to FIG. 15 which is a flow chart of the manufacturing method, and as illustrated in FIG. 15, the method includes:

The step 1501 is to deposit silicon nitride on silicon oxide of an integrated circuit to be processed;

The step 1502 is to perform anisotropic etching on silicon nitride to form sidewalls of silicon nitride on sidewalls of a first layer of polysilicon gate;

The step 1503 is to manufacture a second layer of polysilicon gate; and

The step 1504 is to rinse the sidewalls of silicon nitride.

Figure 16:
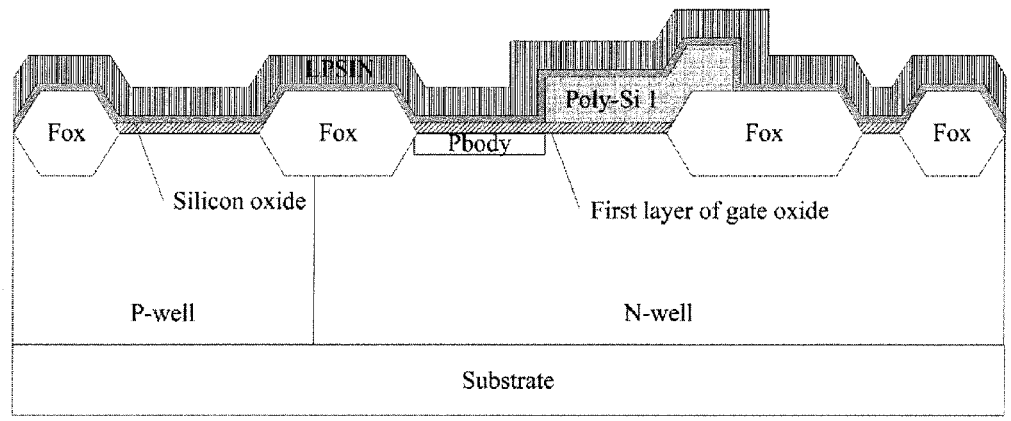
FIG. 16 to FIG. 24 are structural diagrams after respective steps in the manufacturing method in FIG. 15 are performed respectively.

Particularly, reference is made to FIG. 16 for a structural diagram after the step 1501 is performed, where LPSIN represents low-pressure chemical vapor deposited silicon nitride with a thickness of 1000 to 3000 angstroms for the purpose of preventing the silicon surface and the surface of the poly-Si 1 (i.e., the first layer of polysilicon gate here and throughout the following description) from being nitrided in a subsequent thermal processing procedure.

Figure 17:
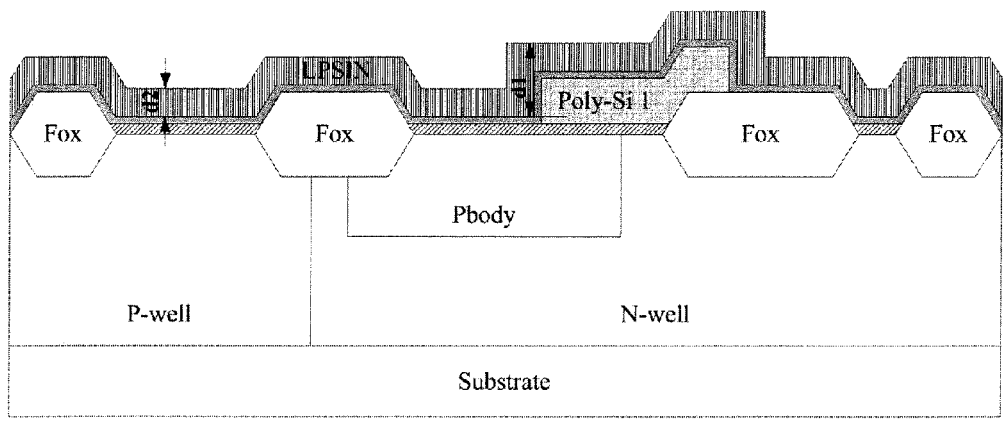

After the step 1501 and before the step 1502, a doped area is thermally processed as illustrated in FIG. 17, and in this embodiment, the doped area is the Pbody, for example, and thermal processing is to sinter the Pbody at a high temperature, but doping can be performed dependent upon the structure and the parameter requirements of the device and thermal processing can be performed dependent upon the structure and the parameter requirements of the device in a practical application, and the invention will not be limited in this regard. Sintering at high temperature is performed in a high-temperature device at a temperature of typically 1050 to 1150 degrees centigrade.

Figure 18:
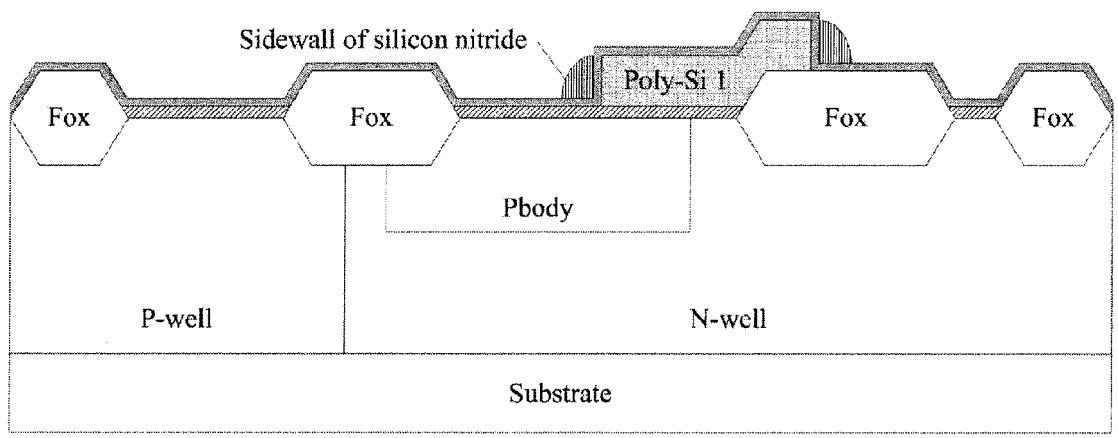

In the step 1502, anisotropic etching is performed on silicon nitride until all the silicon nitride on the surface of the active area and the surface of the field oxide layer is etched with reference to FIG. 18, and in this embodiment, the LPSIN is vertically etched downward using a plasma dry etching device, and etching is terminated when all the LPSIN on the surface of the active area and the surface of the field oxide layer is etched, and since the thickness of the LPSIN in the area of the sidewalls of the poly-Si 1 (particularly the longitudinal thickness referred to as d1 in FIG. 17 here and throughout the following description) is much larger than the thickness of the LPSIN in the planar area (d2 in FIG. 17), the LPSIN in the area of the sidewalls of the poly-Si 1 is reserved automatically after etching is performed, which is referred to as sidewalls of silicon nitride.

Figure 19:
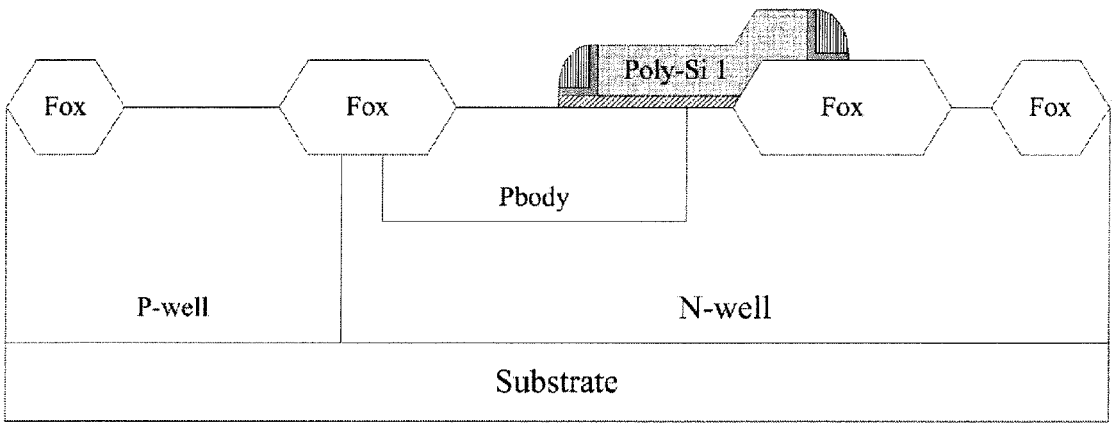

Furthermore silicon oxide and the first layer of gate oxide are etched with reference to FIG. 19, and in this embodiment, the LPTEOS and the first layer of gate oxide bared in FIG. 18 are eroded using diluted hydrofluoric acid, and the first layer of gate oxide at the edges of the poly-Si 1 will not be damaged by the eroding solution due to shielding by the sidewalls of silicon nitride, thus improving the reliability of the device.

Figure 20:
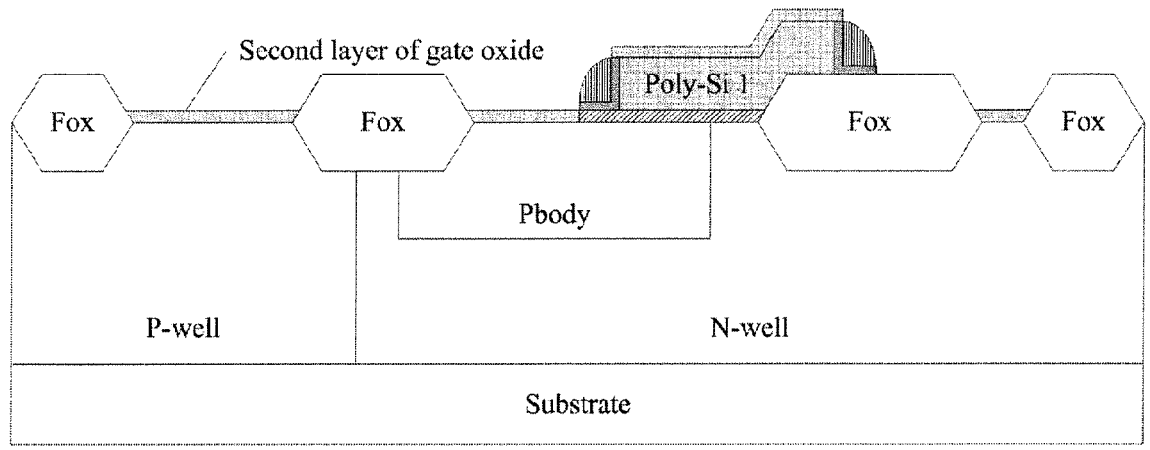
Figure 21:
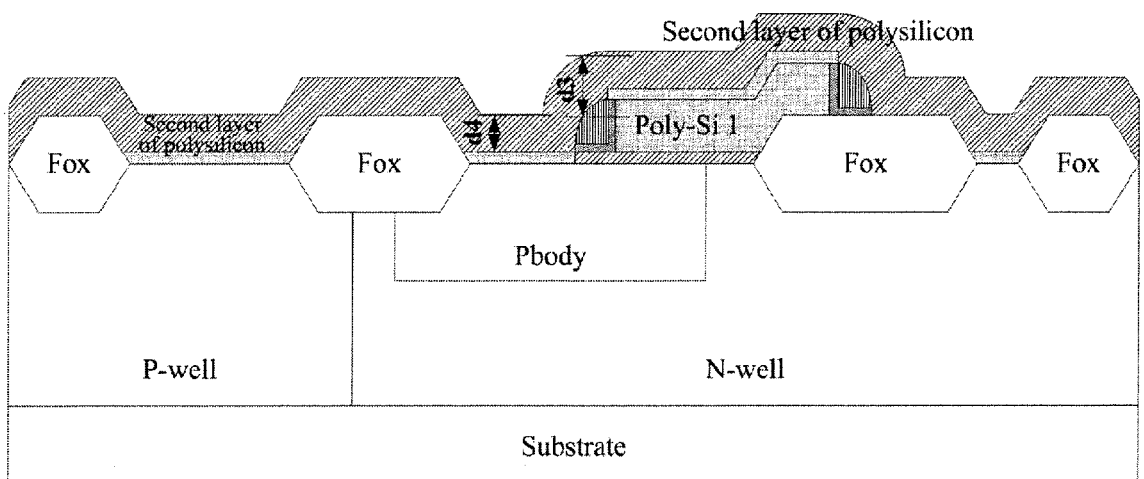
Figure 22:
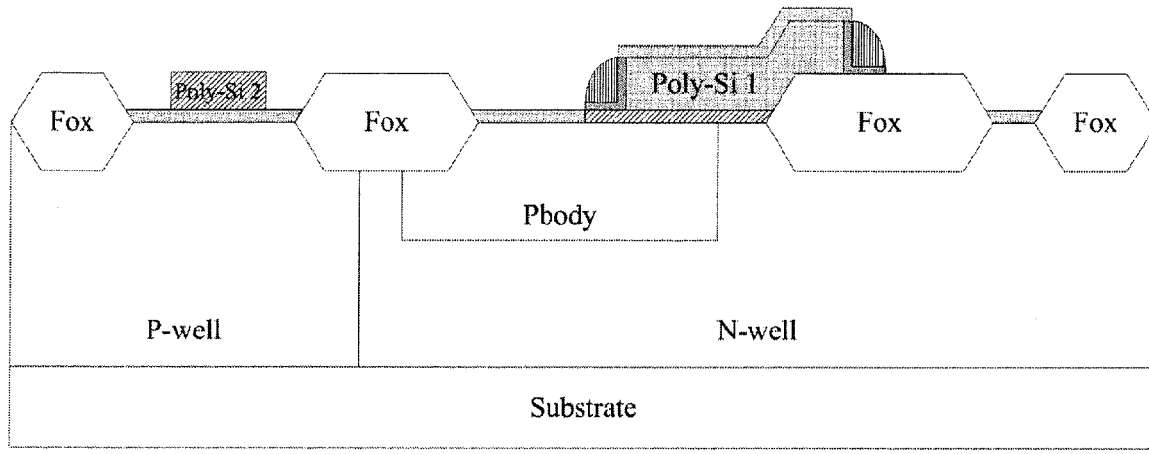

In the step 1503, a specific process of manufacturing the second layer of polysilicon gate is as follows: a second layer of gate oxide is grown on the surface of the active area and the first layer of polysilicon gate with reference to FIG. 20, and as illustrated in FIG. 20, in this embodiment, the second layer of gate oxide is grown on the surface of the active area and the surface of the poly-Si 1; a second layer of polysilicon is deposited on the second layer of gate oxide and the field oxide layer with reference to FIG. 21, and as illustrated in FIG. 21, in this embodiment, the second layer of polysilicon is deposited on the second layer of gate oxide and the field oxide layer; and the second layer of polysilicon is etched to form a second layer of polysilicon gate above the second layer of gate oxide with reference to FIG. 22, and in this embodiment, the reserved area of the second layer of polysilicon gate is covered by photoresist, and the photoresist in the other area is not reserved, and then the second layer of polysilicon in the area which is not covered by the photoresist is etched in a dry etching process, and next the photoresist is removed. As illustrated in FIG. 22, the second layer of polysilicon gate (i.e., the poly-Si 2 in FIG. 22) is located above the second layer of gate oxide. And due to the transition by the sidewalls of silicon nitride, which mitigates a steep step arising from the poly-Si 1, the ratio of the thickness of the second layer of polysilicon in the area of the sidewalls of the poly-Si 1 (see d3 in FIG. 21) to the thickness of the second layer of polysilicon in the planar area (see d4 in FIG. 21) is not as large as in the traditional manufacturing method, thus greatly lowering the difficulty of the etching process.

Figure 23:
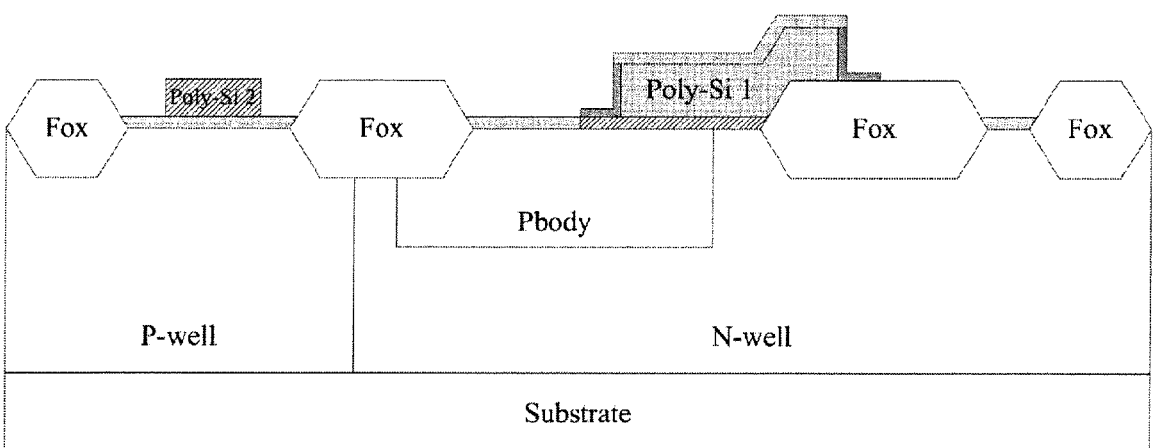

In the step 1504, the sidewalls of silicon nitride are rinsed particularly with reference to FIG. 23 where the sidewalls of silicon nitride are cleaned off using hot phosphoric acid.

Figure 24:
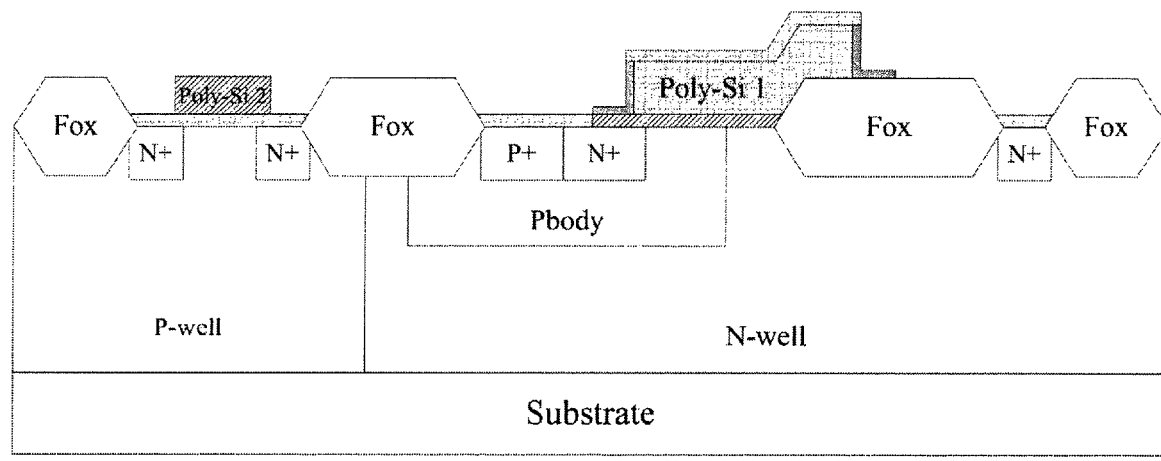

After the foregoing steps are performed, the dual-layer polysilicon gate has been manufactured, and all the other steps are standard processes known to those skilled in the art, e.g., manufacture of N+ and P+ heavily doped areas (see FIG. 24).

In an embodiment of the invention, silicon nitride is deposited on silicon oxide, and anisotropic etching is performed on the silicon nitride, and then the sidewalls of silicon nitride are formed on the sidewalls of the first layer of polysilicon gate, so the first layer of gate oxide beneath the first layer of polysilicon gate will not be damaged during etching of silicon oxide, thus improving the reliability of the device; and furthermore the sidewalls of silicon nitride can mitigate the step arising from the first layer of polysilicon gate, thus lowering the difficulty of the process of etching the second layer of polysilicon.

Apparently those skilled in the art can make various modifications and variations to the invention without departing from the spirit and scope of the invention. Thus the invention is also intended to encompass these modifications and variations thereto provided that these modifications and variations come into the scope of the claims of the invention and their equivalents.

The invention claimed is:

1. A method for manufacturing a polysilicon gate, which is applicable to an integrated circuit to be processed, wherein the method comprises:
    depositing silicon nitride on silicon oxide of the integrated circuit to be processed;
    performing anisotropic etching on the silicon nitride to form sidewalls of silicon nitride on a first layer of gate oxide of a first polysilicon gate of the integrated circuit to be processed;
    manufacturing a second polysilicon gate on the integrated circuit to be processed, wherein the manufacturing the second polysilicon gate comprising growing a second layer of gate oxide on a surface of an active area and the first polysilicon gate of the integrated circuit to be processed, depositing a second layer of polysilicon on the second layer of gate oxide, and etching the second layer of polysilicon to form the second polysilicon gate; and
    rinsing the sidewalls of silicon nitride.

2. The method of claim 1, wherein the anisotropic etching on the silicon nitride is vertical downward etching using dry plasma.

3. The method of claim 1, wherein a thickness of the silicon nitride is 1000 to 3000 angstroms.

4. The method of claim 1, further comprising performing thermal processing on a doped area on the integrated circuit to be processed before the anisotropic etching on the silicon nitride.

5. The method of claim 4, wherein the thermal processing includes sintering at a temperature of about 1050 to 1150 degrees centigrade.

6. A method for manufacturing one or more polysilicon gate comprising:
    forming a first polysilicon gate on a substrate, wherein the first polysilicon gate includes a gate oxide layer and a polysilicon layer;
    forming a layer of silicon oxide on the substrate;
    depositing a layer of silicon nitride on the layer of silicon oxide;
    removing the silicon nitride to form a sidewall at an edge of the first polysilicon gate to protect the first polysilicon gate, wherein the sidewall is on the gate oxide layer;
    forming a second polysilicon gate on the substrate, wherein forming the second polysilicon gate comprising growing a second layer of gate oxide on a surface of an active area and the first polysilicon gate of the integrated circuit to be processed, depositing a second layer of polysilicon on the second layer of gate oxide, and etching the second layer of polysilicon to form the second polysilicon gate; and
    removing the sidewall at the edge of the first polysilicon gate.

7. The method of claim 6, wherein the sidewall of silicon nitride is thicker at the edge of the first polysilicon gate than at the other areas of the sidewall.

8. The method of claim 6, wherein removing the silicon nitride to form the sidewall comprises performing anisotropic etching on the layer of silicon nitride to remove the silicon nitride.

9. The method of claim 8, wherein the anisotropic etching on the silicon nitride comprises vertical downward etching using dry plasma.

10. The method of claim 6, wherein a thickness of the layer of silicon nitride is ranging from 1000 to 3000 angstroms.

11. A method for manufacturing two polysilicon gates on an integrated circuit to be processed, wherein the integrated circuit to be processed comprises an active area and a field area, and the method comprises:
    growing a first layer of gate oxide on the active area;
    depositing a first layer of polysilicon to overlie the field area and the first layer of gate oxide;
    etching the first layer of polysilicon to form a first polysilicon gate;
    depositing silicon oxide to overlie the field area, the first layer of gate oxide and the first polysilicon gate;
    depositing silicon nitride on the silicon oxide;
    performing anisotropic etching on the silicon nitride to form sidewalls of silicon nitride on the first layer of gate oxide of the first polysilicon gate;
    etching the silicon oxide and the first layer of gate oxide;
    growing a second layer of gate oxide on the active area and the first polysilicon gate;
    depositing a second layer of polysilicon to overlie the field area, the second layer of gate oxide and the first polysilicon gate;
    etching the second layer of polysilicon to form a second polysilicon gate; and
    rinsing the sidewalls of silicon nitride.

12. The method of claim 11, wherein the anisotropic etching on the silicon nitride is vertical downward etching using dry plasma.

13. The method of claim 11, wherein a thickness of the silicon nitride is 1000 to 3000 angstroms.

14. The method of claim 11, wherein the silicon nitride is thicker at edges of the first polysilicon gate than at any area, of the integrated circuit to be processed, other than the edges of the first polysilicon gate.

* * * * *